United States Patent
Wu et al.

(10) Patent No.: US 11,888,081 B2
(45) Date of Patent: Jan. 30, 2024

(54) SEMICONDUCTOR DEVICE PACKAGE

(71) Applicant: Advanced Semiconductor Engineering, Inc., Kaohsiung (TW)

(72) Inventors: Mei-Yi Wu, Kaohsiung (TW); Chang Chin Tsai, Kaohsiung (TW); Bo-Yu Huang, Kaohsiung (TW); Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 364 days.

(21) Appl. No.: 17/227,152

(22) Filed: Apr. 9, 2021

(65) Prior Publication Data

US 2022/0328713 A1 Oct. 13, 2022

(51) Int. Cl.
*H01L 31/16* (2006.01)
*H04B 10/40* (2013.01)
*H01L 33/64* (2010.01)
*H01L 33/62* (2010.01)
*H01L 31/024* (2014.01)

(52) U.S. Cl.
CPC ............ *H01L 31/16* (2013.01); *H01L 31/024* (2013.01); *H01L 33/62* (2013.01); *H01L 33/644* (2013.01); *H04B 10/40* (2013.01)

(58) Field of Classification Search
None
See application file for complete search history.

(56) References Cited

U.S. PATENT DOCUMENTS

| | | | |
|---|---|---|---|
| 9,105,613 B1* | 8/2015 | Chen | H01L 23/552 |
| 9,653,642 B1* | 5/2017 | Raring | H01L 33/0093 |
| 2015/0069113 A1* | 3/2015 | Wang | H05K 3/3494 |
| | | | 228/102 |
| 2016/0085038 A1* | 3/2016 | Decker | G02B 6/428 |
| | | | 385/14 |
| 2016/0284920 A1* | 9/2016 | Saugier | H01L 31/0203 |
| 2020/0335452 A1* | 10/2020 | Tai | H01L 23/552 |
| 2021/0134702 A1* | 5/2021 | Chang | H01L 24/32 |
| 2021/0257311 A1* | 8/2021 | Hsieh | H01L 23/552 |

OTHER PUBLICATIONS

Vixar, "Vixar Application Note VCSEL Thermal Performance", May 15, 2019, 11 pages.

* cited by examiner

*Primary Examiner* — Benjamin P Sandvik
(74) *Attorney, Agent, or Firm* — FOLEY & LARDNER LLP

(57) ABSTRACT

The present disclosure provides a semiconductor device package. The semiconductor device package includes a substrate having a first surface and a second surface opposite to the first surface, an optical device disposed on the first surface of the substrate, and an electronic device disposed on the second surface of the substrate. A power of the electronic device is greater than a power of the optical device. A vertical projection of the optical device on the first surface is spaced apart from a vertical projection of the electronic device on the second surface by a distance greater than zero.

14 Claims, 8 Drawing Sheets

SEMICONDUCTOR DEVICE PACKAGE

BACKGROUND

1. Technical Field

The present disclosure relates to a semiconductor device package.

2. Description of the Related Art

A light transmission module (e.g., a light fidelity (LiFi) module) including an optical module and an electrical module has been utilized for data transmission through visible light. Conventionally, the optical module and the electrical module are integrated on different substrates by virtue of higher degree of respective design freedom and less thermal interference. However, both the optical module and the electrical module have to be assembled in a case for example, in a stacking manner, causing the overall thickness of the module being too large to meet market needs.

SUMMARY

In some embodiments, an electronic device includes a semiconductor device package. The semiconductor device package includes a substrate having a first surface and a second surface opposite to the first surface, an optical device disposed on the first surface of the substrate, and an electronic device disposed on the second surface of the substrate. A power of the electronic device is greater than a power of the optical device. A vertical projection of the optical device on the first surface is spaced apart from a vertical projection of the electronic device on the second surface by a distance greater than zero.

In some embodiments, an electronic device includes a substrate having a first surface and a second surface opposite to the first surface, a first component disposed on the first surface of the substrate, a second component disposed on the second surface of the substrate, and a third component disposed on the first surface of the substrate or the second surface of the substrate. The first component has a first power. The second component has a second power. The third component has a third power. The first power or the second power is greater than the third power. The first component is spaced apart from the second component along a direction perpendicular to a normal direction of the first surface.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
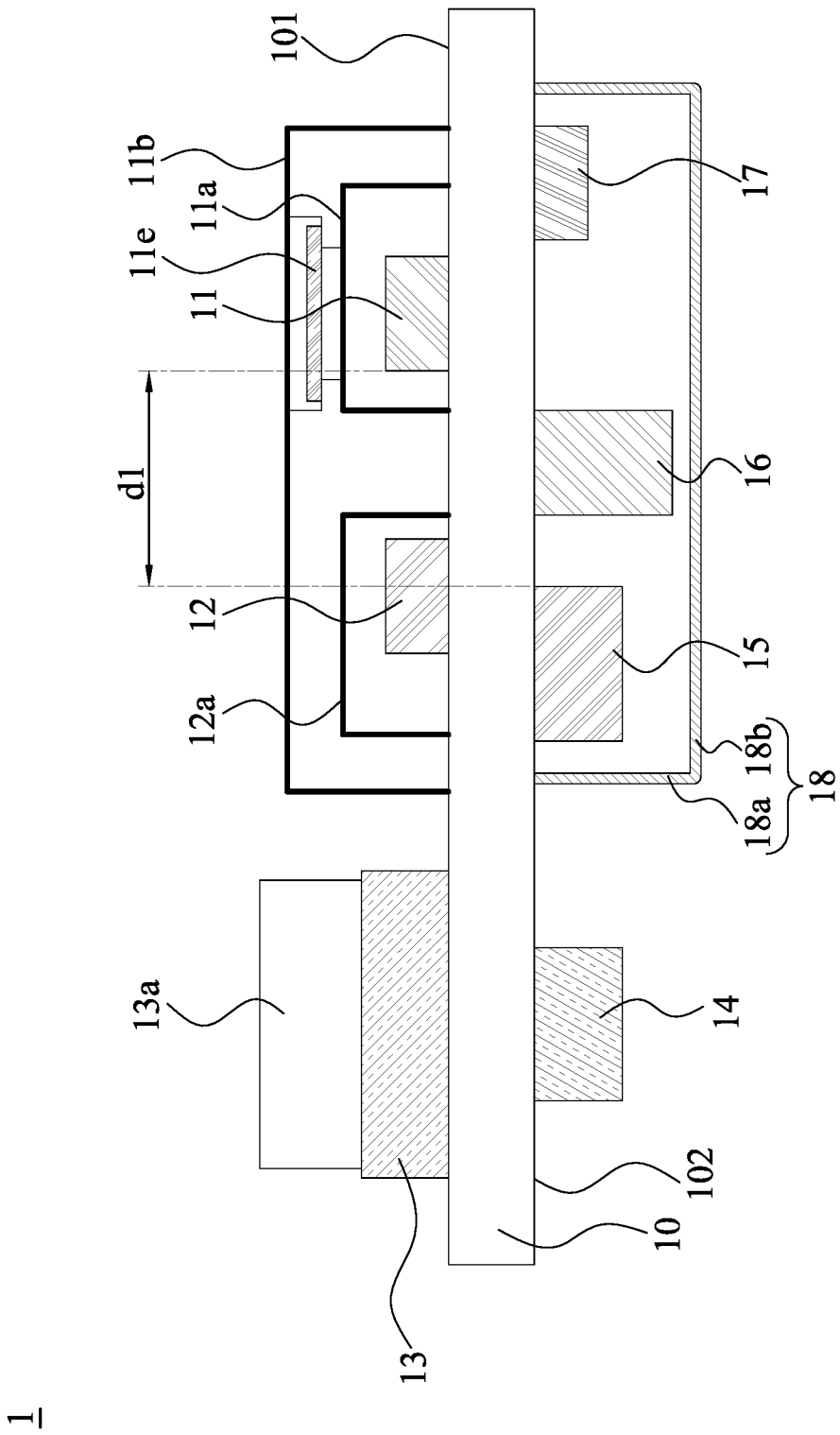
FIG. 1 is a cross-sectional view of a semiconductor device package, in accordance with an embodiment of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description involves an antenna module and a semiconductor device package having the antenna module.

FIG. 1 illustrates cross-sectional view of a semiconductor device package 1, in accordance with an embodiment of the present disclosure. The semiconductor device package 1 may include an optical module, such as an optical communication module or an optical transceiver. For example, the semiconductor device package 1 may include a light fidelity (LiFi) module or other modules that use light (such as visible light, ultraviolet light, and infrared light) as a medium to deliver data or signals.

As shown in FIG. 1, the semiconductor device package 1 may include a substrate 10 having a surface 101 and a surface 102 opposite to the surface 101. A plurality of components are disposed on the surface 101 and the surface 102 of the substrate 10, respectively. In some embodiments, the plurality of components may include active or passive optical devices, active or passive electrical devices, connectors, and equivalents thereof. For example, a mixture of optical devices and electrical devices can be disposed on either of the surface 101 or the surface 102. For example, only optical devices are disposed on the surface 101 and only the electronic devices are disposed on the surface 102. In some embodiments, the plurality of components include an optical device 11, an electronic device 12, an optical device 13, a electronic device 14, an electronic device 15, an electronic device 16, and an electronic device 17, and a case 18 enclosing the electronic devices 15, 16, and 17 to assist, in one aspect, thermal dissipation of the semiconductor device package 1. People having ordinary skill in the art may understand that some of the components exemplified above may be omitted or rearranged in other locations due to different purpose and design, and the contemplated scope of the present disclosure should not be limited therewith.

In some embodiments, the substrate 10 may be, for example, a printed circuit board, such as a paper-based copper foil laminate, a composite copper foil laminate, or a polymer-impregnated glass-fiber-based copper foil laminate. In some embodiments, the substrate 10 may include an interconnection structure, such as a redistribution layer (RDL) and a grounding layer. In some embodiments, the substrate 10 may include one or more conductive pads (not illustrated in the figures) in proximity to, adjacent to, or embedded in and exposed at the surface 101 and the surface 102 of the substrate 10. The substrate 10 may include solder resists (or solder mask) (not illustrated in the figures) on the surface 101 and the surface 102 of the substrate 10 to fully expose or to expose at least a portion of the conductive pads for electrical connections.

In some embodiments, the optical device 11 may include a light source or a light emitting component. For example, the optical device 11 may be configured to generate light. For example, the optical device 11 may be configured to generate light as a medium to deliver data or signals to a light detector. In some embodiments, the optical device 11 may include a laser diode, such as vertical-cavity surface-emitting laser (VCSEL). However, other types of light emitting component, such as organic electroluminescence (EL) elements and light emitting diodes (LEDs), may be employed as the light emitting component in the semiconductor device package 1. In some embodiments, the optical device 11 may have an operating temperature region in order to alleviate or prevent degradation (such as lumen degradation) and improve the reliability of the semiconductor device package 1. For example, the maximum operating of the optical device 11 may be less than an advisable temperature. For example, the junction temperature of the VCSEL (such as the temperature in the active region of the VCSEL) may be less than an advisable temperature, such as less than 60° C.

In some embodiments, in order to alleviate or prevent the heat generated by the other electronic components or electronic devices from affecting the optical device 11, there is no electronic component (including the active electronic component and the passive electronic component) disposed opposite the optical device 11. For example, as shown in FIG. 1, a vertical projection of the optical device 11 on the surface 101 of the substrate 10 may be free from overlapping with a vertical projection of any active electronic component or any passive electronic component on the surface 102 of the substrate 10. For example, as shown in FIG. 1, a vertical projection of the optical device 11 on the surface 101 of the substrate 10 may be spaced apart from a vertical projection of any active electronic component or any passive electronic component on the surface 102 of the substrate 10. Specifically, the electronic device 14, the electronic device 15, the electronic device 16, and the electronic device 17 on the surface 102 of the substrate 10 are disposed on locations not vertically overlapping with the optical device 11. For example, each of the electronic device 14, the electronic device 15, the electronic device 16, and the electronic device 17 is not disposed opposite the optical device 11. For example, each of the electronic device 14, the electronic device 15, the electronic device 16, and the electronic device 17 is spaced apart from the location opposite the optical device 11.

In some embodiments, each of the electronic device 14, the electronic device 15, the electronic device 16, and the electronic device 17 may be a thermal source component of the semiconductor device package 1. For example, each of the electronic device 14, the electronic device 15, the electronic device 16, and the electronic device 17 may generate Joule heat due to current flow during an operating process of the semiconductor device package 1. For example, in some embodiments, the electronic device 15 may include a radio frequency (RF) transistor. In some embodiments, the RF transistor may possess a power of about 150 mW to 200 mW and can be the device with highest power in the semiconductor device package, thus becoming a major heat source in the package. In some embodiments, heat generated by the electronic device 15 may negatively influence the nearby optical device 11 and may cause overheating of the optical device 11.

In some embodiments, each of the electronic device 14, electronic device 15, the electronic device 16, and the electronic device 17 may be a chip or a die including a semiconductor substrate, one or more integrated circuit devices and one or more overlying interconnection structures therein. The integrated circuit devices may include active devices such as transistors. The integrated circuit devices may include passive devices such as resistors, capacitors, inductors, or a combination thereof.

In some embodiments, each of the electronic device 15, the electronic device 16, and the electronic device 17 may be electrically connected to one or more of other electrical components and to the substrate 10, and the electrical connections may be attained by way of flip-chip or wire-bond techniques. Although there are one connector and three electronic components in FIG. 1, the number of the connector and the number of the electronic components are not limited thereto. In some embodiments, there may be any number of connectors and any number of electronic components depending on design requirements. In some embodiments, the semiconductor device package 1 may include a connector that can provide electrical connections between the semiconductor device package 1 and external components (e.g. external circuits or circuit boards). For example, the connector may be a rectangular connector, a circular connector, a terminal block, or other feasible connectors.

In some embodiments, the components (e.g., the optical device 11 and the electronic device 15) that have the greatest power and the second-greatest power among the components in the semiconductor device package 1 may be disposed on opposite sides of the substrate 10 (i.e., the surface 101 of the substrate 10 and the surface 102 of the substrate 10). For example, the power of the optical device 11 may be greater than the power of each of the electronic device 12, the optical device 13, the electronic device 14, the electronic device 16, and the electronic device 17. For example, the power of the electronic device 15 may be greater than the power of each of the electronic device 12, the optical device 13, the electronic device 14, the electronic device 16, and the electronic device 17. In some embodiments, the power of the optical device 11 is greater than the power of the electronic device 15. In some embodiments, the power of the electronic device 15 is greater than the power of the optical device 11.

In some embodiments, the components (e.g., the optical device 11 and the electronic device 15) that have the greatest power and the second-greatest power among the components in the semiconductor device package 1 may be laterally spaced apart from each other. For example, from the cross-sectional view in FIG. 1, the optical device 11 may be spaced apart from the electronic device 15 by a distance "d1" along a direction substantially parallel to the surface 101 of the substrate 10. In some embodiments, the distance d1 may be greater than zero. For example the shortest distance (e.g., the distance d1) between the optical device 11 and the electronic device 15 may be greater than zero.

In some embodiments, the vertical projections of the components (e.g., the optical device 11 and the electronic device 15) that have the greatest power and the second-greatest power among the components in the semiconductor device package 1 may not overlapped. In some embodiments, a vertical projection of the optical device 11 on the surface 101 of the substrate 10 may be free from overlapping with a vertical projection of the electronic device 15 on the surface 102 of the substrate 10. For instance, a vertical projection of the optical device 11 on the surface 101 of the substrate 10 may be not overlapped with a vertical projection of the component 15 on the surface 102 of the substrate 10. For instance, a vertical projection of the optical device 11 on the surface 101 of the substrate 10 may be spaced apart from a vertical projection of the component 15 on the surface 102 of the substrate 10. For example, from a top view, the optical device 11 may be spaced apart from the electronic device 15 by a distance along x-axis and spaced apart from the electronic device 15 by a distance along y-axis. The x-axis and the y-axis may be substantially parallel to the surface 101 of the substrate 10. The surface 101 of the substrate 10 may be substantially perpendicular with z-axis. The normal direction of the surface 101 of the substrate 10 may be along the z-axis. The x-axis and the y-axis may be substantially perpendicular with each other. The distance along the x-axis and the distance along the y-axis may be greater than zero.

In some embodiments, arranging the key thermal source of the semiconductor device package 1 (e.g., the electronic device 15) laterally spaced apart from the optical device 11 may help alleviate or prevent the electronic device 15 from heating the optical device 11 and may help prevent the temperature of the optical device 11 from exceeding an advisable temperature. Therefore, the reliability of the semiconductor device package 1 may be improved.

In some embodiments, the case 18 may include a first portion 18a and a second portion 18b defining a space for accommodating the electronic device 15, the electronic device 16, and the electronic device 17. The second portion 18b may have a bottom surface and three sidewalls, and the first portion 18a may connect with the bottom surface and two sidewalls of the second portion 18b. In some embodiments, the first portion 18a may include a lid portion. In some embodiments, the second portion 18b may include a wall portion, such as a structure with four sided wall.

In an exemplary manufacturing process of forming the semiconductor device package 1, the second portion 18b may be disposed on the surface 102 of the substrate 10 with the bottom surface facing the surface 102 and the three sidewalls surrounding the electronic device 15, the electronic device 16, and the electronic device 17. Then the first portion 18a may be disposed on the surface 102 of the substrate 10 to connect with the surface 102, the bottom surface, and two sidewalls of the second portion 18b. Therefore, the case 18 may surround the electronic device 15, the electronic device 16, and the electronic device 17.

In some embodiments, the electronic device 15 may be closer to the case 18 than any other components in the semiconductor device package 1. For example, the electronic device 15 may be closer to the case 18 than the electronic device 16 to the case 18. For example, the electronic device 15 may be closer to the case 18 than the electronic device 17 to the case 18. In some embodiments, the first portion 18a of the case 18 may be in contact with the electronic device 15. For instance, the electronic device 15 may directly contact the inner surface of the first portion 18a of the case 18. In some embodiments, the case 18 may help cool the electronic device 15 and may help prevent the temperature of the optical device 11 from exceeding an advisable temperature. Therefore, the reliability of the semiconductor device package 1 may be improved.

In some embodiments, the case 18 may function as a shielding layer to provide an electromagnetic interference (EMI) protection for the electronic device 15, the electronic device 16, and the electronic device 17. For example, the case 18 may function as a shielding layer while also help dissipate heat from the electronic device 15, the electronic device 16, and the electronic device 17.

In some embodiments, the case 18 may contact the grounding element of the substrate 10. In some embodiments, the case 18 may be electrically connected with the grounding element of the substrate 10. In some embodiments, the case 18 may be electrically connected with the grounding element of the substrate 10 through a solder paste or other conductive elements. In some embodiments, the case 18 may include, for example, aluminum (Al), copper (Cu), chromium (Cr), tin (Sn), gold (Au), silver (Ag), nickel (Ni) or stainless steel, or a mixture, an alloy, or other combination thereof. The case 18 may include a single conductive layer or multiple conductive layers. In some embodiments, the case 18 may include multiple conductive layers, and the multiple conductive layers may include a same material, or ones of the multiple conductive layers may include different materials, or each of the multiple conductive layers may include different materials from others of the multiple conductive layers.

In some embodiments, the optical device 13 may include a light detecting component. In some embodiments, the optical device 13 may include an avalanche photodiode (APD). In some other embodiment, other types of light detecting component, such as positive-intrinsic-negative (PIN) diodes, negative-intrinsic-positive (NIP) diodes, or photovoltaic converters, may be employed as the light detecting component in the semiconductor device package 1. In some embodiments, the optical device 13 may include an optical element 13a formed along with the optical device 13 to collect, guide, and focus the light from the optical device 11 onto the optical device 13.

In some embodiments, the electronic device 12 may include a transimpedance amplifier (TIA) or other signal processing integrated circuits for processing signals (e.g., the electrical pulses) output by the optical device 13. In some embodiments, a cover or a lid 11a may cover the optical device 11. The cover 11a may have an opening where one or more optical elements 11e may be disposed to collect, guide, and focus the light from the optical device 11 onto the optical device 13. In some embodiments, examples of the one or more optical elements 11e may include a filter, a polarizer, a collimator, a diffuser, or other lens or microlenses. In some embodiments, a cover 12a may cover the electronic device 12 to protect the electronic device 12, such as to reduce dark current. In some embodiments, a cover 11b may cover the optical device 11 and the electronic device 12 to protect the optical device 11 and the electronic device 12. The cover 11b may have an opening corresponding to the one or more optical elements 11e. In some embodiments, the number, the location, the shape, the dimension, the direction of the covers 11a, 11b, and 12a may be adjusted based on the design requirements of the present disclosure and are not limited to the particular embodiment as illustrated in FIG. 1.

In some embodiments, the electronic device 12 may be disposed between the optical device 11 and the optical device 13. For example, the electronic device 12 may be disposed between the light emitting component and the light detecting component. In some embodiments, the distance between the optical device 11 (e.g., the light emitting component) and the optical device 13 (e.g., the light detecting component) may be set such that the light from the optical device 11 can be efficiently detected by the optical device 13. In other words, the distance between the optical device 11 and the optical device 13 may be required. The electronic device 12 may be disposed between the optical device 11 and the optical device 13 to use the space between the optical device 11 and the optical device 13. Therefore, the size of the semiconductor device package 1 may be miniature and the cost may be reduced.

Figure 2:
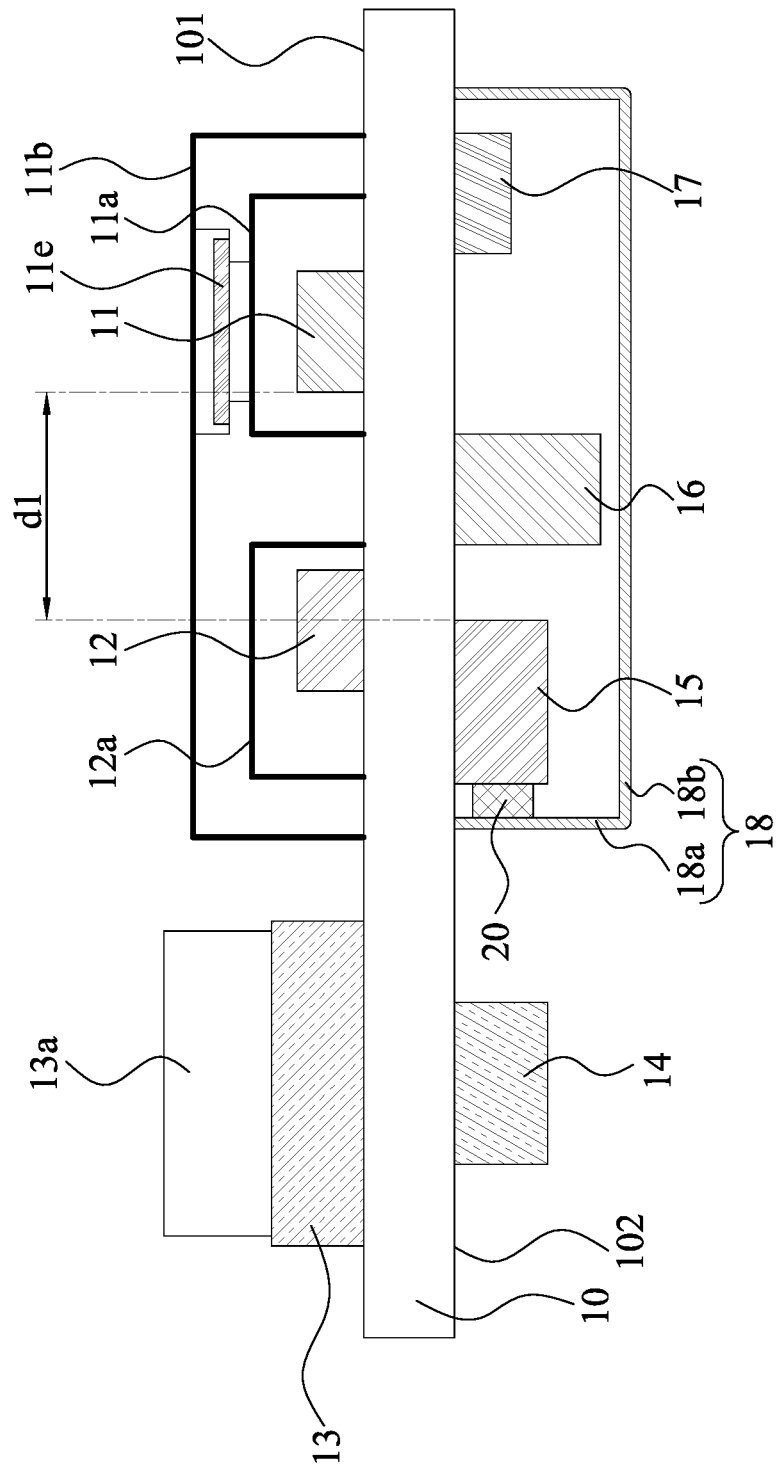
FIG. 2 is a cross-sectional view of a semiconductor device package, in accordance with an embodiment of the present disclosure.

FIG. 2 illustrates cross-sectional view of a semiconductor device package 2, in accordance with an embodiment of the present disclosure. The semiconductor device package 2 in FIG. 2 is similar to the semiconductor device package 1 in FIG. 1, except that the semiconductor device package 2 further includes a thermal paste 20 disposed on the first portion 18a of the case 18.

The thermal paste 20 may be disposed between the electronic device 15 and the first portion 18a of the case 18. The thermal paste 20 may contact the electronic device 15 and the first portion 18a of the case 18. In some embodiments, the thermal paste 20 may be electrically non-conductive. In some embodiments, the thermal paste 20 may include a matrix with electrically insulating, but thermally conductive filler. In some embodiments, matrix materials may include epoxies, silicones (Silicone grease), urethanes, and acrylates, or other polymerizable liquid matrix. In some embodiments, fillers may include ceramic powder, such as silica powder, alumina powder, etc. In some embodiments, the thermal paste 20 may be electrically conductive. For example, the thermal paste 20 may include silver paste.

In an exemplary manufacturing process of forming the semiconductor device package 2, the second portion 18b may be disposed on the surface 102 of the substrate 10 with the bottom surface facing the surface 102 and the three sidewalls surrounding the electronic device 15, the electronic device 16, and the electronic device 17. The thermal paste 20 may be applied on the first portion 18a. Then the first portion 18a may be disposed on the surface 102 of the substrate 10 to connect with the surface 102, the bottom surface, and two sidewalls of the second portion 18b. The first portion 18a may be attached or connected to the electronic device 15 through the thermal paste 20.

In some embodiments, the thermal paste 20 may be applied on the other inner surfaces of the case 18. For example, the thermal paste 20 may be applied on one or more sidewalls of the second portion 18b. For example, the thermal paste 20 may be applied on the bottom surface of the second portion 18b.

In some embodiments, the thermal paste 20 may enhance heat dissipation for the electronic device 15. For example, the thermal paste 20 may allow for an efficient transfer of heat from the electronic device 15 to the case 18. Therefore, the thermal paste 20 may help prevent the temperature of the optical device 11 from exceeding an advisable temperature and improve the reliability of the semiconductor device package 2.

Figure 3:
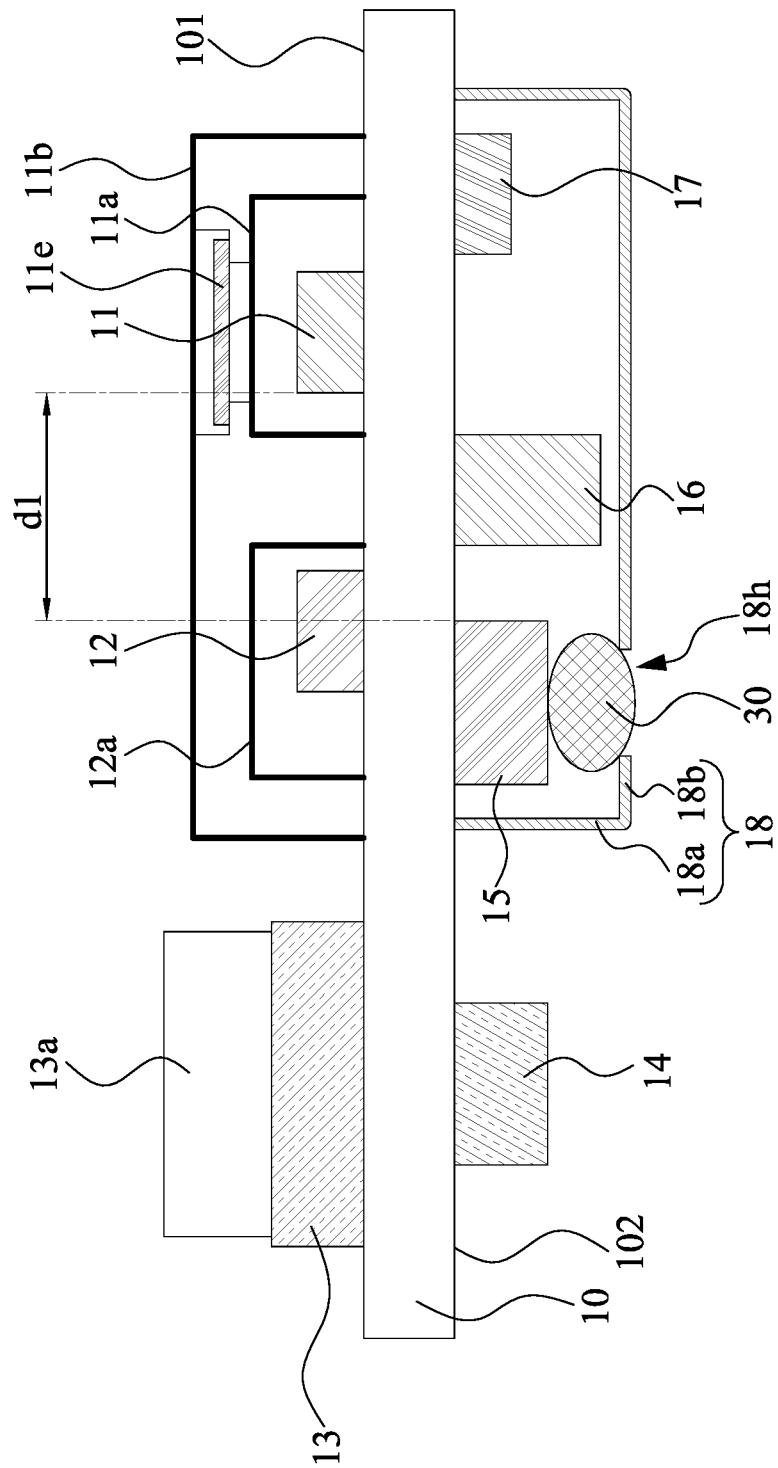
FIG. 3 is a cross-sectional view of a semiconductor device package, in accordance with an embodiment of the present disclosure.

FIG. 3 illustrates cross-sectional view of a semiconductor device package 3, in accordance with an embodiment of the present disclosure. The semiconductor device package 3 in FIG. 3 is similar to the semiconductor device package 1 in FIG. 1, except that the semiconductor device package 3 further includes a thermal paste 30 disposed in an opening 18h of the case 18.

The opening 18h may be formed on the bottom surface of the case 18 such that the electronic device 15 may be exposed from the opening 18h. For example, a vertical projection of the opening 18h on the surface 102 of the substrate 10 may be overlapped with a vertical projection of the electronic device 15 on the surface 102 of the substrate 10. The thermal paste 30 may contact the electronic device 15 and the case 18.

In an exemplary manufacturing process of forming the semiconductor device package 3, the case 18 may be disposed on the surface 102 of the substrate 10 with the electronic device 15 exposed from the opening 18h. Then the thermal paste 30 may be applied on the electronic device 15 through the opening 18h.

The materials and the characteristics of the thermal paste 30 may be the same or similar to the thermal paste 20 and will not be repeated hereafter.

Figure 4:
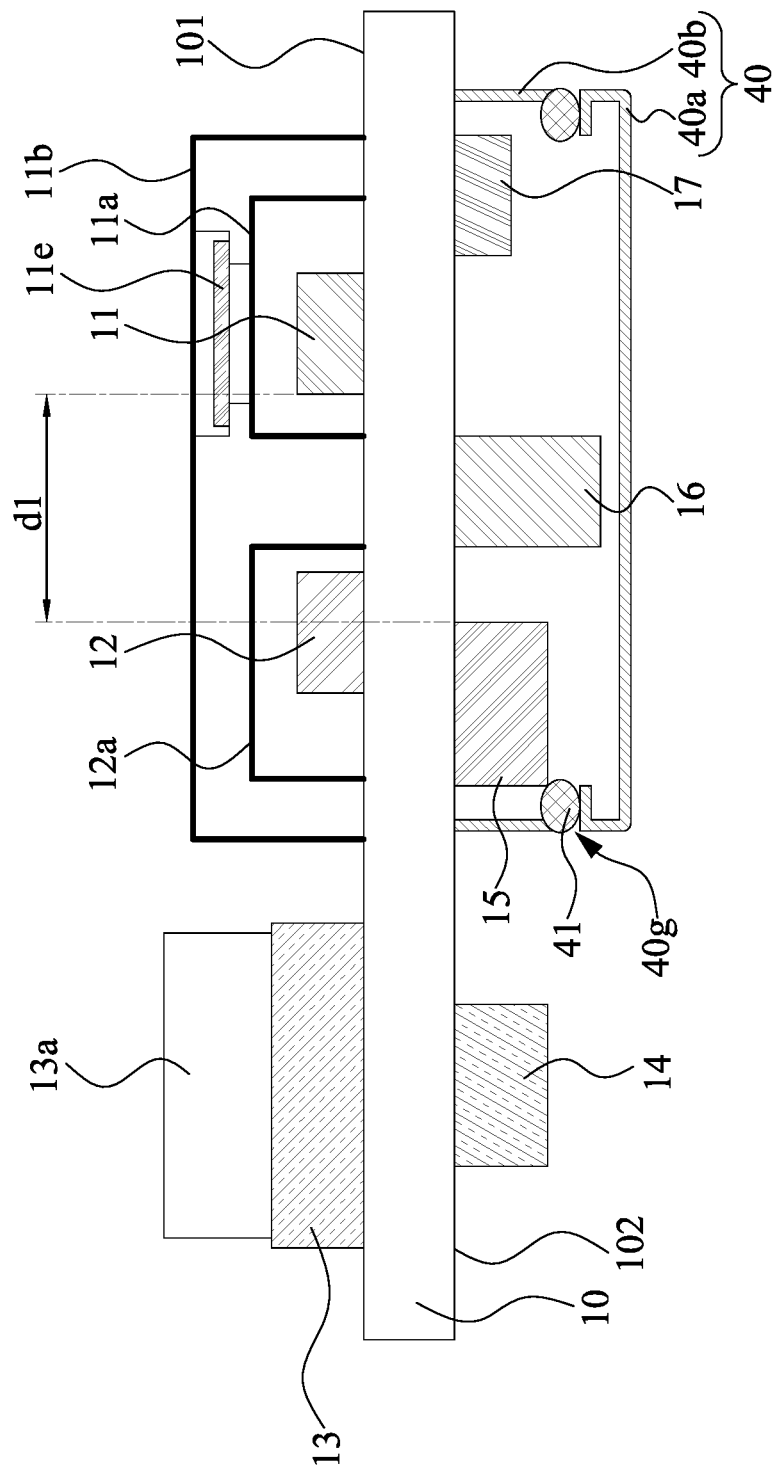
FIG. 4 is a cross-sectional view of a semiconductor device package, in accordance with an embodiment of the present disclosure.

FIG. 4 illustrates cross-sectional view of a semiconductor device package 4, in accordance with an embodiment of the present disclosure. The semiconductor device package 4 in FIG. 4 is similar to the semiconductor device package 1 in FIG. 1, except the differences therebetween described below.

As shown in FIG. 4, the case 40 of the semiconductor device package 4 may have a bottom portion 40a and a sidewall portion 40b. The sidewall portion 40b may be disposed on the surface 102 of the substrate 10 and surround the electronic device 15, the electronic device 16, and the electronic device 17. The bottom portion 40a may cover the electronic device 15, the electronic device 16, and the electronic device 17 and may be spaced apart from the sidewall portion 40b by a gap. The bottom portion 40a may have an end bending inwardly. The end of the bottom portion 40a may be spaced apart from the sidewall portion 40b by a gap 40g.

The electronic device 15 may be exposed through the gap 40g between the bottom portion 40a and the sidewall portion 40b. A thermal paste 41 may be disposed on the end of the bottom portion 40a. The thermal paste 41 may be disposed between the bottom portion 40a and the sidewall portion 40b. The thermal paste 41 may contact the electronic device 15, the bottom portion 40a, and the sidewall portion 40b.

In an exemplary manufacturing process of forming the semiconductor device package 4, the sidewall portion 40b may be disposed on the surface 102 of the substrate 10 to surround the electronic device 15, the electronic device 16, and the electronic device 17. The bottom portion 40a may be suspended over the surface 102 of the substrate 10 such that the electronic device 15 is exposed from the gap 40g, such as partially exposed from the gap 40g. Then the thermal paste 41 may be applied to contact the electronic device 15 through the gap 40g.

The materials and the characteristics of the thermal paste 41 may be the same or similar to the thermal paste 20 and will not be repeated hereafter.

Figure 5:
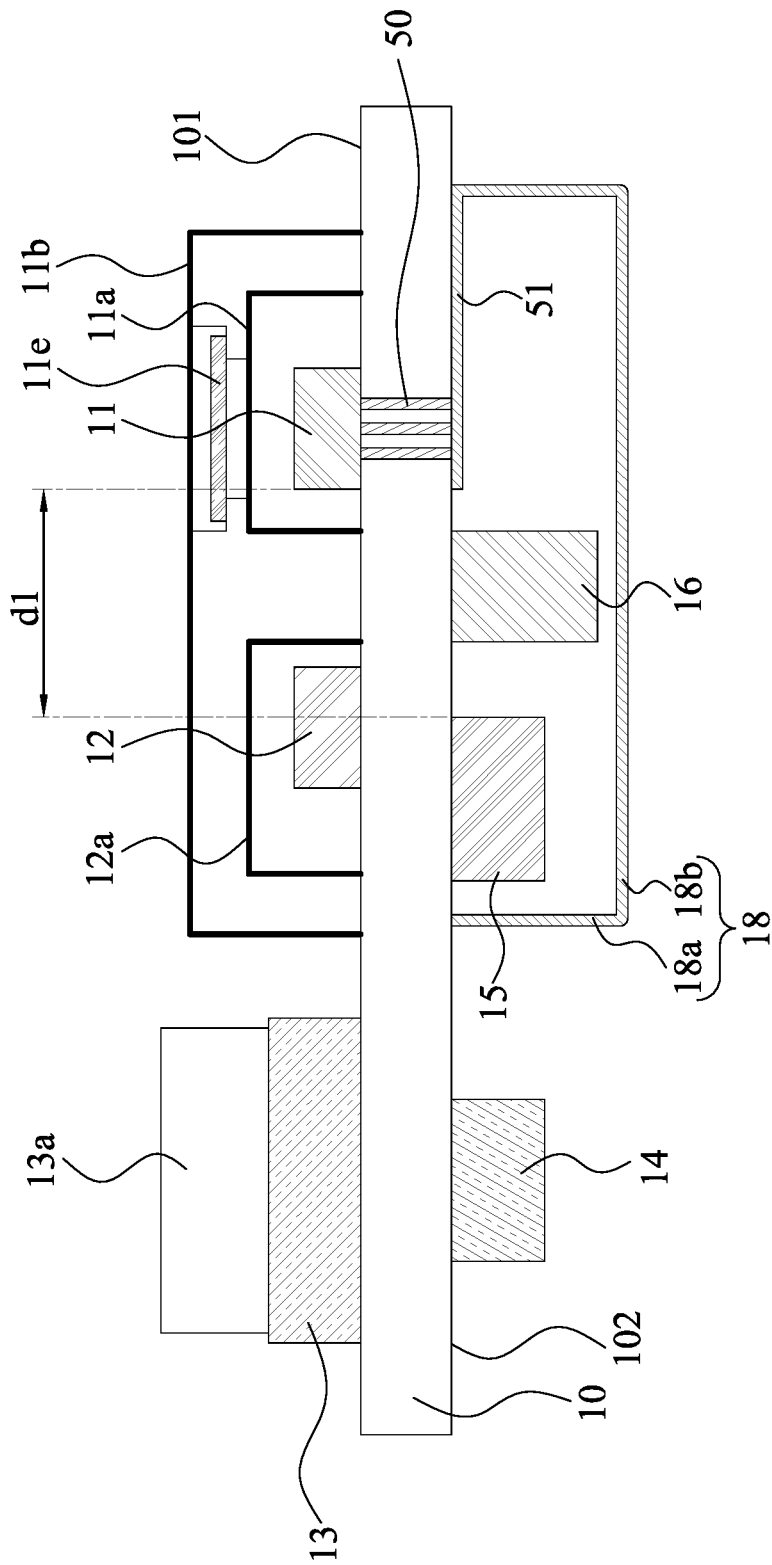
FIG. 5 is a cross-sectional view of a semiconductor device package, in accordance with an embodiment of the present disclosure.

FIG. 5 illustrates cross-sectional view of a semiconductor device package 5, in accordance with an embodiment of the present disclosure. The semiconductor device package 5 in FIG. 5 is similar to the semiconductor device package 1 in FIG. 1, except the differences therebetween described below.

As shown in FIG. 5, the case 18 of the semiconductor device package 5 may have an extension 51. The extension 51 may be connected with a sidewall (e.g., the open case 18b) of the case 18. The extension 51 may be an extending part of the case 18.

The extension 51 may be in contact with a conductive element (such as a through via 50) in the substrate 10. The through via 50 may be in contact with the optical device 11. The extension 51 may be in thermal conduction with the optical device 11 through the through via 50. The extension 51 may be in contact with the surface 102 of the substrate 10. The substrate 10 may be disposed between the extension 51 and the optical device 11. A vertical projection of the extension 51 on the surface 102 of the substrate 10 may be overlapped with a vertical projection of the optical device 11 on the surface 101 of the substrate 10.

In an exemplary manufacturing process of forming the semiconductor device package 5, the case 18 may land on the surface 102 of the substrate 10. An end of the case 18 may bend inwardly to form the extension 51 in contact with the through via 50.

In some embodiments, the extension 51 may enhance heat dissipation for the optical device 11. For example, the extension 51 may allow for an efficient transfer of heat from the optical device 11 to the case 18. Therefore, the extension 51 may help prevent the temperature of the optical device 11 from exceeding an advisable temperature and improve the reliability of the semiconductor device package 5.

Figure 6:
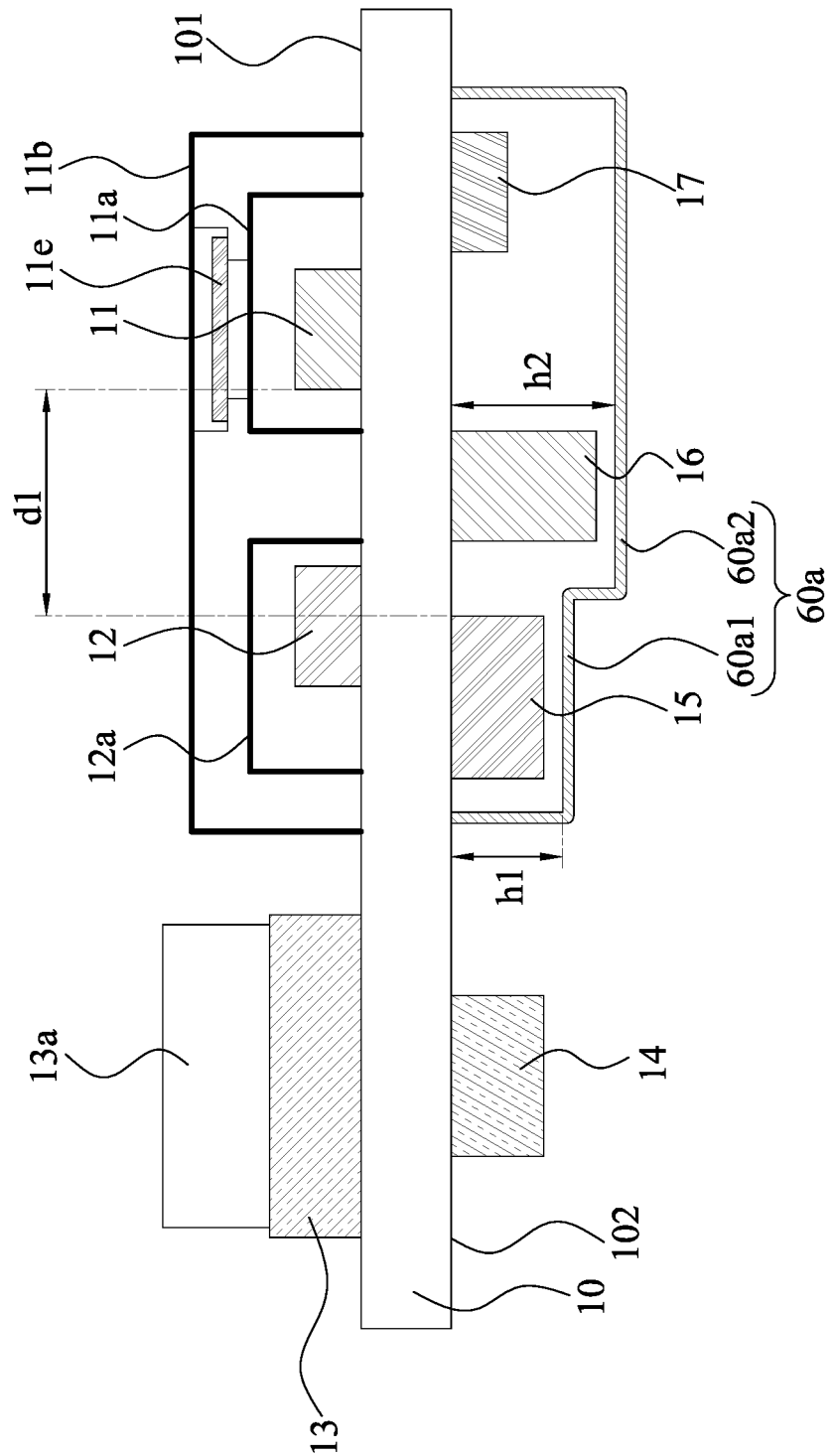
FIG. 6 is a cross-sectional view of a semiconductor device package, in accordance with an embodiment of the present disclosure.

FIG. 6 illustrates cross-sectional view of a semiconductor device package 6, in accordance with an embodiment of the present disclosure. The semiconductor device package 6 in FIG. 6 is similar to the semiconductor device package 1 in FIG. 1, except the differences therebetween described below.

As shown in FIG. 6, the case of the semiconductor device package 6 may have a portion 60a1 and a portion 60a2. The portion 60a1 may be recessed toward the substrate 10 with respect to the portion 60a2. The portion 60a1 may be a recess portion. A vertical projection of the portion 60a1 on the surface 102 of the substrate 10 may be overlapped with a vertical projection of the electronic device 15 on the surface 102 of the substrate 10.

In some embodiments, the case 60a includes a recessed portion proximal to the electronic device 15 such that compared to the case without the recessed portion, the recessed portion of present embodiment is located closer to the electronic device 15 than to any other components on the second surface 102 of the substrate 10, for example, the electronic device 16 or the electronic device 17. In some embodiments, since the portion 60a1 is recessed in order to be closer to a top side of the electronic device 15, the portion 60a1 may enhance heat dissipation for the electronic device 15. For example, the portion 60a1 may allow for an efficient transfer of heat from the electronic device 15 to the case 60a. Therefore, with a better thermal management to the electronic device 15, the portion 60a1 may help preventing the temperature of the optical device 11 from exceeding an advisable temperature and improve the reliability of the semiconductor device package 6.

Figure 7:
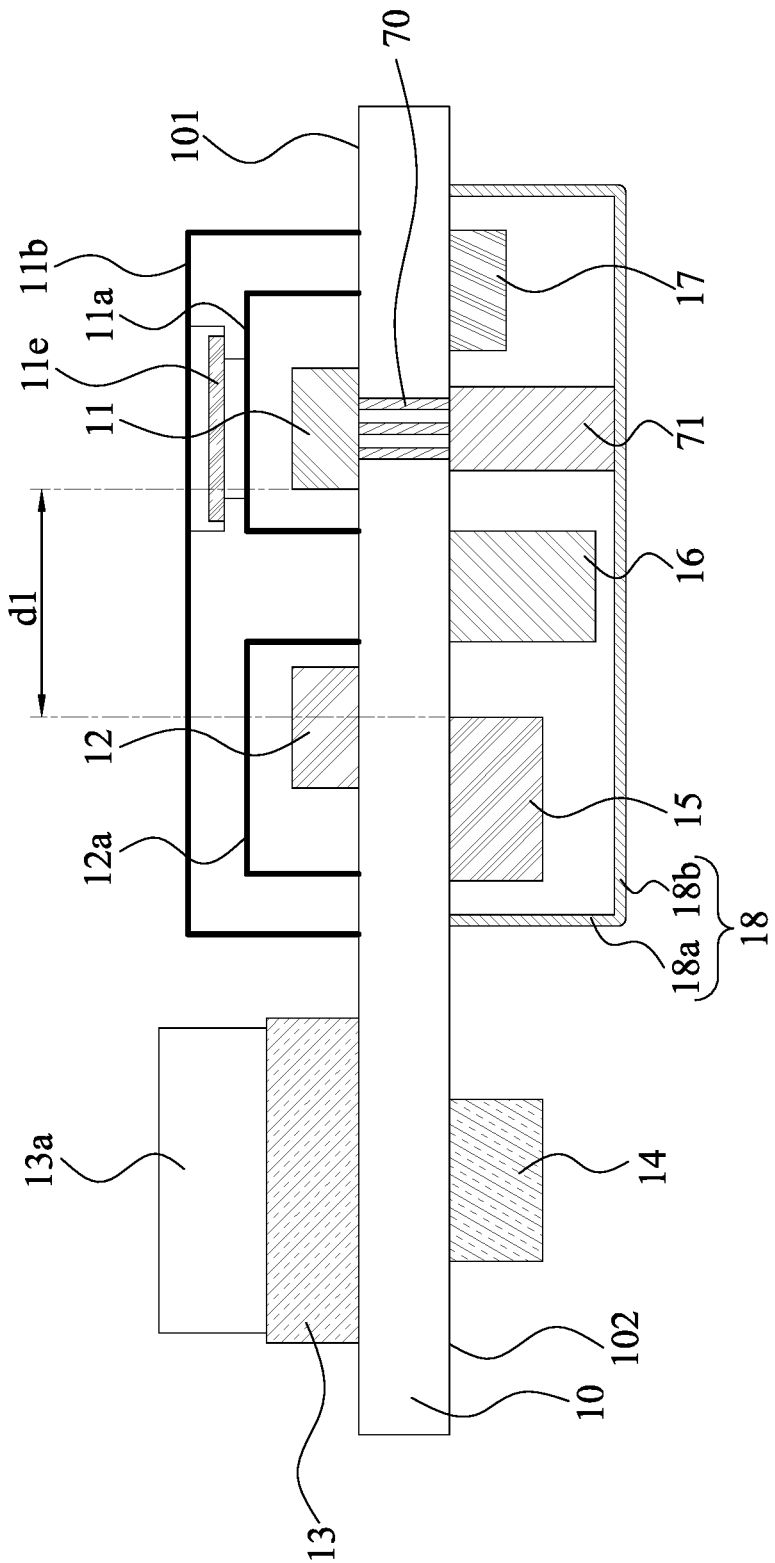
FIG. 7 is a cross-sectional view of a semiconductor device package, in accordance with an embodiment of the present disclosure.

FIG. 7 illustrates cross-sectional view of a semiconductor device package 7, in accordance with an embodiment of the present disclosure. The semiconductor device package 7 in FIG. 7 is similar to the semiconductor device package 1 in FIG. 1, except that the semiconductor device package 7 further includes a heat conductor 71 disposed on the surface 102 of the substrate 10.

The heat conductor 71 may be in contact with a conductive element (such as a through via 70) in the substrate 10. The through via 70 may be in contact with the optical device 11. The heat conductor 71 may be in thermal conduction with the optical device 11 through the through via 70. The heat conductor 71 may be in contact with the surface 102 of the substrate 10. The substrate 10 may be disposed between the heat conductor 71 and the optical device 11. A vertical projection of the heat conductor 71 on the surface 102 of the substrate 10 may be overlapped with a vertical projection of the optical device 11 on the surface 101 of the substrate 10. The heat conductor 71 may be in contact with the inner surface of the case 18.

In some embodiments, the heat conductor 71 may enhance heat dissipation for the optical device 11. For example, the heat conductor 71 may allow for an efficient transfer of heat from the optical device 11 to the case 18. Therefore, the heat conductor 71 may help prevent the temperature of the optical device 11 from exceeding an advisable temperature and improve the reliability of the semiconductor device package 7.

Figure 8:
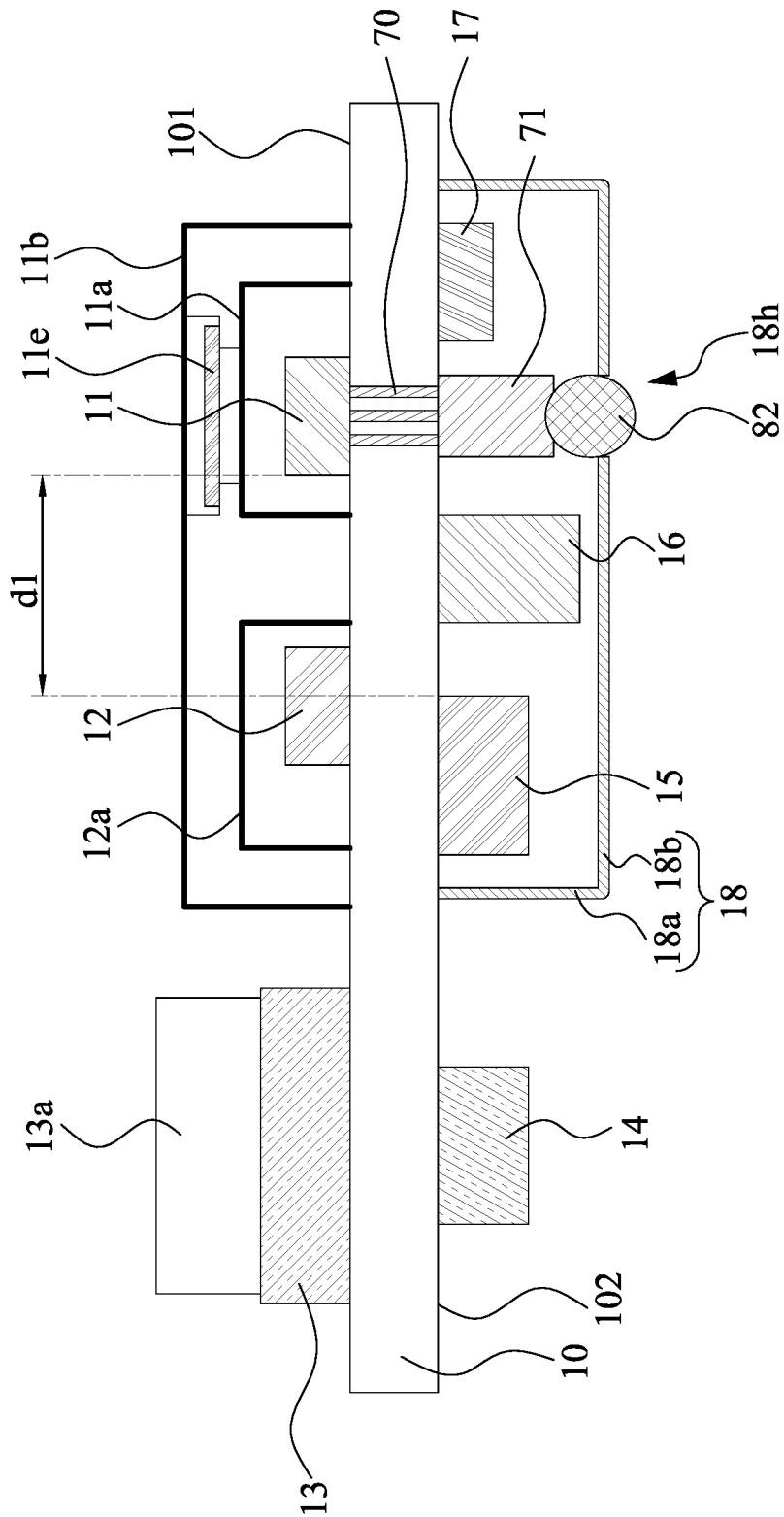
FIG. 8 is a cross-sectional view of a semiconductor device package, in accordance with an embodiment of the present disclosure.

FIG. 8 illustrates cross-sectional view of a semiconductor device package 8, in accordance with an embodiment of the present disclosure. The semiconductor device package 8 in FIG. 8 is similar to the semiconductor device package 7 in FIG. 7, except that the semiconductor device package 8 further includes a thermal paste 82 disposed in an opening 18h of the case 18.

The opening 18h may be formed on the bottom surface of the case 18 such that the heat conductor 71 may be exposed from the opening 18h. For example, a vertical projection of the opening 18h on the surface 102 of the substrate 10 may be overlapped with a vertical projection of the heat conductor 71 on the surface 102 of the substrate 10. The thermal paste 30 may contact the heat conductor 71 and the case 18.

In some embodiments, the thermal paste 82 and the heat conductor 71 may enhance heat dissipation for the optical device 11. For example, the thermal paste 82 and the heat conductor 71 may allow for an efficient transfer of heat from the optical device 11 to the case 18. Therefore, the thermal paste 82 and the heat conductor 71 may help prevent the temperature of the optical device 11 from exceeding an advisable temperature and improve the reliability of the semiconductor device package 8.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a substrate having a first surface and a second surface opposite to the first surface;
   an optical device disposed on the first surface of the substrate; and
   an electronic device disposed on the second surface of the substrate, wherein a power of the electronic device is greater than a power of the optical device;
   a case disposed on the second surface of the substrate and defining a space for accommodating the electronic device; and
   a first thermal paste connecting the case and the electronic device;
   wherein a vertical projection of the optical device on the first surface is spaced apart from a vertical projection of the electronic device on the second surface by a distance greater than zero;
   wherein the vertical projection of the optical device on the first surface overlaps with a vertical projection of the case on the second surface of the substrate.

2. The semiconductor device package of claim 1, wherein the electronic device is an RF transistor.

3. The semiconductor device package of claim 1, wherein the vertical projection of the optical device on the first surface is spaced apart from the vertical projection of any other active device or passive device on the second surface of the substrate by a distance greater than zero.

4. The semiconductor device package of claim 1, further comprising:
   a through via connecting the first surface and the second surface of the substrate, wherein the through via is in contact with the optical device;
   a heat conductor disposed on the second surface of the substrate and in contact with the through via; and
   a second thermal paste connecting the case and the heat conductor.

5. The semiconductor device package of claim 1, wherein the case has an extension on the second surface of the substrate and overlapping with the optical device in a direction substantially perpendicular to the first surface of the substrate.

6. The semiconductor device package of claim 5, wherein the extension is in thermal conduction with the optical device through a through via of the substrate.

7. The semiconductor device package of claim 1, wherein the optical device comprises a light emitting component.

8. The semiconductor device package of claim 1, wherein the case comprises a recessed portion proximal to the electronic device.

9. The semiconductor device package of claim 8, wherein the recessed portion is closer to the electronic device than to other components on the second surface of the substrate.

10. A semiconductor device package, comprising:
    a substrate having a first surface and a second surface opposite to the first surface;
    a first component disposed on the first surface of the substrate, the first component having a first power;
    a second component disposed on the second surface of the substrate, the second component having a second power;

a third component disposed on the first surface of the substrate or the second surface of the substrate, the third component having a third power, wherein either the first power or the second power is greater than the third power;

a case disposed on the second surface of the substrate and covering the second component, wherein the case comprises an opening; and a thermal paste disposed in the opening of the case;

wherein the first component is spaced apart from the second component along a direction perpendicular to a normal direction of the first surface.

11. The semiconductor device package of claim 10, wherein the second power is greater than the first power.

12. The semiconductor device package of claim 10, wherein the third component comprises a photo diode, a passive component, or an amplifier.

13. The semiconductor device package of claim 10, wherein the thermal paste is disposed on an inner sidewall of the case.

14. A semiconductor device package, comprising:
a substrate having a first surface and a second surface opposite to the first surface;
a first component disposed on the first surface of the substrate, the first component having a first power;
a second component disposed on the second surface of the substrate, the second component having a second power;
a third component disposed on the first surface of the substrate or the second surface of the substrate, the third component having a third power, wherein either the first power or the second power is greater than the third power;
a through via connecting the first surface and the second surface of the substrate, wherein the through via is in contact with the first component; and
a heat conductor disposed on the second surface of the substrate and in contact with the through via;
wherein the first component is spaced apart from the second component along a direction perpendicular to a normal direction of the first surface.

* * * * *